BIDIRECTIONAL IGFET WITH SYMMETRICAL LINEAR RESISTANCE
WITH SPECIFIC SUBSTRATE VOLTAGE CONTROL

Filed March 22, 1965

INVENTOR.
RICHARD E. WERNER
BY
Eugene M. Whitacre
Attorney

United States Patent Office 3,441,748
Patented Apr. 29, 1969

3,441,748
BIDIRECTIONAL IGFET WITH SYMMETRICAL LINEAR RESISTANCE WITH SPECIFIC SUBSTRATE VOLTAGE CONTROL

Richard E. Werner, Trenton, N.J., assignor to Radio Corporation of America, a corporation of Delaware Filed Mar. 22, 1965, Ser. No. 441,495
Int. Cl. H03k 5/08, 3/26, 19/08
U.S. Cl. 307—237 4 Claims

ABSTRACT OF THE DISCLOSURE

A voltage-controlled variable resistance circuit including an insulated-gate field-effect transistor in which linearity of signal translation is improved by coupling to the substrate of the transistor a portion of the signal voltage developed across its output electrodes, the portion being given by the fraction $gm_G/2gm_{s\mu}$ where $gm_{s\mu}$ represents the transconductance exhibited by the substrate and where $gm_G$ represents the transconductance exhibited by the substrate and gate when connected together.

Figure 1:
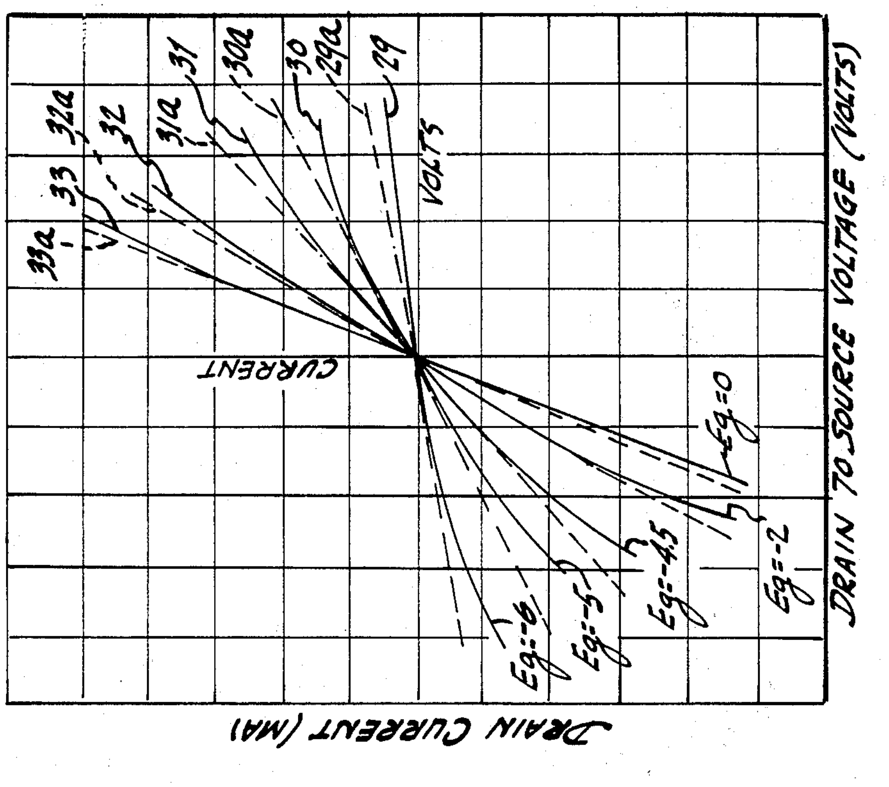

This invention relates in general to electrical circuits embodying bidirectionally semiconductor devices, and more particularly to electrical circuits embodying bidirectional semiconductor devices which are utilized as voltage controlled variable resistances.

Some known types of semiconductor devices have particularly useful applications as variable resistance devices due to their bidirectional characteristics. A voltage-controlled variable resistance device is useful in combination with signal translating circuits such as a compression or expansion amplifier or peak limiters used for sound effects and dynamic range modification in broadcast and recording systems in which it is desired to control the amplitude of the signal to be translated.

When bidirectional transistors are employed as variable resistance devices it is desirable that the resistance exhibited by the semiconductor device be symmetrical for input signals of both polarities. Asymmetry in operation is due to the fact that the device operates in a common source mode for one polarity of signal excursion and in a common drain mode for the opposite polarity of signal excursion.

In the case of high quality audio compression or expansion amplifiers in broadcast and recording systems, the distortion introduced by the asymmetry of operation of bidirectional transistors is several times greater than that permissible. For example, it is required to have a compression range of 20 db with less than 1% distortion over the entire range. One way of improving the linearity of such circuits is to apply a portion of the signal developed across the output and common electrodes of the transistor to the input electrode. If a control signal is also applied to the input electrode, the effect of the signal on the input electrode tends to complicate the design of the circuit by requiring signal bypass capacitors in the control circuit which in turn affects the speed of response of the control circuit.

Accordingly, it is an object of this invention to provide an improved voltage-controlled variable resistance network employing a semiconductor device having a bidirectional characteristic that is sufficiently linear to employ in broadcast and recording expansion, compression, and peak limiting amplifiers.

The variable resistance circuit embodying the invention includes a field-effect semiconductor device having a gate electrode and first and second electrodes formed on a substrate of semiconductor material defining a current path. The device is of a type such that a voltage applied to the substrate can control the resistance exhibited by the current path. A signal voltage that is in phase with and bears a predetermined amplitude with respect to the signal voltage developed across the current path of the semiconductor device, is applied to the substrate for the purpose of causing the semiconductor device to exhibit a symmetrical resistance to input signals of either polarity. The resistance of the current path is controlled by a control voltage applied between the gate electrode and a point of reference potential. The amplitude of signal voltage applied to the substrate is determined by a ratio of the transconductance characteristic exhibited by the gate electrode and substrate when connected together to the transconductance characteristic exhibited by the substrate alone times the amount of signal voltage that would have to be applied to the gate electrode to render the current path of the semiconductor device symmetrical to signals of either polarity. For symmetrical field effect devices, where the gate electrode is equidistant from the first and second electrodes, this latter signal voltage is substantially one-half that developed across the first and second electrodes.

Figure 2:
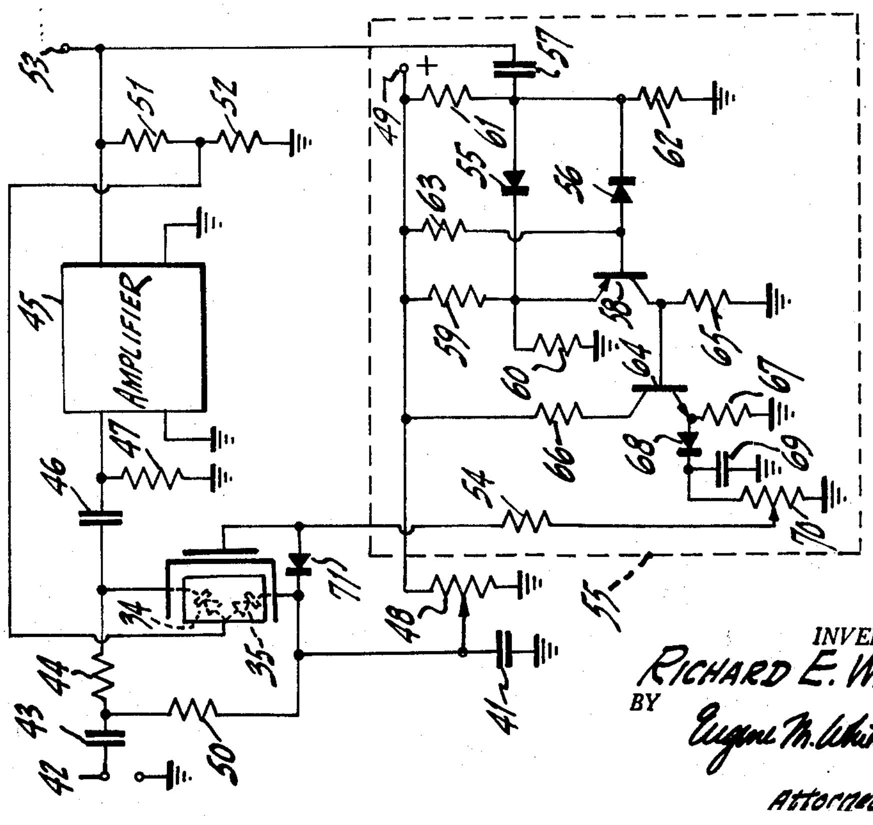

The novel features which are considered characteristic of the invention are set forth with particularity in the appended claims. The invention itself, however, both as to its organization and method of operation as well as additional objects and advantages thereof will best be understood from the accompanying drawings in which:

FIGURE 1 is a graph showing a family of drain current versus source-to-drain voltage curves for various values of gate-to-source voltages for an insulated-gate field-effect transistor; and FIGURE 2 is a schematic diagram of a circuit embodying the invention.

FIGURE 1 is a family of curves 29–33 illustrating the linear portion below the knee of the drain current versus drain voltage characteristic of an insulated-gate field-effect transistor such as an RCA 3N98 type of device known as an MOS transistor. The term "drain electrode" is used to refer to the electrode to which a positive bias voltage is applied, and the term "source electrode" is used to refer to the electrode to which a negative bias (with respect to the other electrode) is applied.

In order to more easily explain the conditions for obtaining the curves shown in FIGURE 1, one of the two electrodes will always be referred to as the drain electrode regardless of the polarity of the bias voltage applied thereto, and the other electrode will be referred to as the source electrode. The portion of the curves 29–33 shown in the first quadrant in FIGURE 1 were obtained by applying a bias potential to the drain electrode which is positive with respect to the potential of the source electrode, and by biasing the gate electrode with respect to the source electrode by a voltage having a magnitude as indicated by the dimension of $E_g$ (gate voltage) corresponding to each of the curves 29–33. The portion of the curves 29–33 corresponding to the third quadrant were obtained by reversing the polarity of the bias voltage applied between the source and drain electrodes, i.e., by applying a bias potential to the drain electrode which is negative with respect to the potential of the source electrode. The insulated-gate field-effect transistor can operate as a variable resistance which varies in magnitude as a function of the gate-to-source bias voltage applied. The transistor may be operated with no direct current bias voltage between the source and drain electrodes, for example, and by applying an alternating current signal across the conductive channel the variation of the current flowing through the channel will follow the path of one of the curves 29–33 selected by the magnitude of the gate-to-ground bias voltage being applied.

Where the drain and source regions are of N-type material and the substrate is of a P-type material a P-N rectifying junction is formed at each of the interfaces between the drain and source regions and the substrate. The pair of rectifying junctions are illustrated as diodes 34 and 35 in FIGURE 2. The rectifying junctions 34 and 35 are poled in such a manner that a positive voltage applied to the substrate with respect to the drain and source electrodes renders the rectifying junctions 34 and 35 conductive.

It should be noted that the curves 29–33 are unsymmetrical in the first quadrant with respect to the corresponding curves in the third quadrant. Furthermore, the curves 29–33 in the first quadrant bend toward the abscissa (the voltage axis) as the voltage applied across the drain and source increases while on the other hand the curves in third quadrant bend toward the ordinate axis (the current axis). The bends in the curves are exaggerated for illustration purposes. In systems that can tolerate a fair amount of distortion the asymmetry can be neglected. On the other hand in broadcast and recording systems where such distortion cannot be tolerated, the asymmetry found in the curves 29–33 is generally beyond the allowable tolerance.

According to Patent No. 3,131,312 issued to F. L. Putzrath, the asymmetry found between the first and third quadrants of a junction type of field-effect transistor is compensated by applying one-half the drain-to-source signal voltage to the gate electrode. This is done by connecting two equal series resistors between the source and drain electrodes and connecting the junction of the two series resistors to the gate electrode. Although applying one-half the drain-to-source signal voltage to the gate electrodes does in fact linearize the bidirectional operation of the field-effect transistor, it also introduces a signal voltage into the D-C biasing control circuit for the gate electrode. This in many cases is undesirable.

Circuits embodying the invention include insulated-gate field-effect transistors of the type known as MOS transistors. In such transistors both the gate and substrate exhibit a control over the source-to-drain current. In presently available devices the *gm* of the gate electrode and substrate when connected together is larger than the *gm* exhibited by the substrate alone.

As previously mentioned, if one-half the signal appearing across the drain and source electrodes is applied to the gate electrode the bidirectional operation of the transistor is linearized. It is herein proposed to linearize the transistor characteristics by applying signal voltage to the substrate. The signal to be applied to the substrate is greater than that required at the gate electrode due to the lower *gm* of the substrate electrode. For example, $$E_{s\mu}=\frac{gm_G E_{D-S}}{2gm_{s\mu}}$$

where $E_{s\mu}$ is the signal applied to the substrate electrode, $gm_G$ is the transconductance exhibited by the gate and substrate electrodes when connected together, $gm_{s\mu}$ is the transconductance exhibited by the substrate electrode, and $E_{D-S}$ is the signal voltage between the drain and source electrodes. The signal voltage required to be applied to the substrate in many cases exceeds the signal voltage developed across the drain and source electrodes.

FIGURE 2 is a peak limiting and compression-expansion circuit embodying the invention. An insulated-gate field-effect transistor 40 is connected to act as a variable resistor having its source electrode connected to ground through a signal bypass capacitor 41 (low impedance to signal frequencies so that the source electrode is effectively grounded for signal frequencies) and its drain electrode connected to an input terminal 42 through a series coupling capacitor 43 and a series dropping resistor 44. Input signals to be controlled are applied between the input terminal 42 and ground. The drain electrode is also coupled to the input circuit of an amplifier 45 through a coupling capacitor 46. A resistor 47 is connected between the input of the amplifier 45 and ground to minimize the effect of changes of input impedance of the amplifier upon the variable resistance circuit.

The drain and source electrodes are biased wtih respect to the substrate electrode and the gate electrode by a voltage developed across a portion of a potentiometer 48 connected between a supply point 49 (adapted to be connected to the positive terminal of a power supply, not shown) and ground. The variable arm of the potentiometer 48 is directly connected to the source electrode and is also connected to the drain electrode through the resistors 44 and 50.

Substantially no direct current (D-C) flows through the resistors 44 and 50 and therefore the drain and source electrodes are at the same D-C potential. The drain and source electrodes are kept at the same D-C potential to prevent the transistor from amplifying the voltage present at the gate electrode thereby preventing the introduction of "thump" transient. "Thump" is a transient voltage introduced into audio system due to a shift in D-C potential at the gate electrode. The transient is transmitted through the audio system to give rise to an undesirable "thump" in the output of the system.

If a depletion type insulated-gate field-effect transistor is to be used, such as an RCA 3N98 (exhibiting relatively low drain-to-source resistance at zero gate-to-source biasing voltage) a positive voltage (with respect to the gate electrode) is applied to the source electrode by adjusting the potentiometer 48 for the required gate-to-source bias voltage to provide high drain-to-source resistance under weak signal conditions. The positive voltage at the source and drain electrodes also reverse biases the rectifying junctions 34 and 35.

A portion of the output signal of the amplifier 45 developed at the junction of the series resistance 51 and 52, connected between the output terminal 53 and ground, is coupled to the substrate electrode to linearize the bidirectional operation of the insulated-gate field-effect transistor 40. The D-C voltage level at the junction of resistors 51 and 52 is small relative to the D-C voltage applied to the source and drain regions by potentiometer 48. The signal applied to the substrate electrode relative to ground is in phase with the input signal applied between the input termial 42 and ground.

In operation, when the signal voltage developed at the drain electrode is positive with respect to the source electrode (first quadrant FIGURE 1) a voltage that is increasing positively with respect to the source electrode is applied to the substrate. An increasing positive going signal on the substrate decreases the resistivity of the source-to-drain path of the insulated gate field-effect transistor 40.

The effect of the positive going linearizing signal applied to the substrate shifts the curves 29, 30, 31, 32 and 33 toward the ordinate (current axis) to the dashed curves **29*a*, 30*a*, 31*a*, 32*a* and 33*a***.

On the other hand, when the drain electrode is negative with respect to the source electrode (third quadrant) a voltage that is increasing negatively with respect to the source electrode is applied to the substrate. An increasing negative signal increases the resistivity of the source-to-drain current path of the insulated-gate field-effect transistor 40. The effect of the negative going linearizing signal applied to the substrate shifts the curves 29–30 toward the abscissa (voltage axis) to the dashed curves **29*a*–33*a***.

Effectively the impedance between the drain and source electrode changes with the signal on the substrate to produce the same amount of linearization as if the signals were placed on the gate electrode. With the linearizing signal applied to the substrate electrode the distortion is reduced to less than 0.3%, which is highly acceptable for broadcast and recording purposes.

The control circuit for developing a control voltage to vary the drain-to-source resistance exhibited by the insulated-gate field-effect transistor 40 is shown within the dashed block 55. The control circuit 55, depending upon the biasing arrangement of the various components therein, will effectively control the drain-to-source resistance of the insulated-gate field-effect transistor so that the circuit of FIGURE 2 acts as a peak limiter or a compression and/or expansion amplifier. Peak limiters are used in commercial broadcast systems to prevent overmodulation, and in public address systems to prevent the blasting sounds of one who "swallows the mike" as compared to the person who is afraid to get to close. The gain of the system is not reduced until a threshold level is exceeded. The gain reduction must be fast to compensate for peak inputs while the gain increase must be slow to prevent the circuit from acting as a clipper.

A volume compression system is generally used in high-fidelity recording systems where the dynamic range of the system must be compressed because of limitations in the recording medium. A compression system compresses the gain of the system over the entire range. The output voltage from the control circuit is applied to the gate electrode in a polarity to reduce the drain-to-source impedance of the insulated-gate field-effect transistor 40 thereby controlling (limiting) the amount of signal that is applied to the amplifier 45.

The output signals from the amplifier 45 are coupled to two diodes 55 and 56 through a coupling capacitor 57. The diode 55 is poled to rectify the positive portions of the input signal and applies positive pulses to the emitter electrode of a transistor 58. The diode 56 is poled to rectify the negative portion of the input signal and apply negative pulses to the base electrode of the transistor 58.

A biasing network is provided for reverse biasing the transistor 58 to cut-off and for forward biasing the diodes 55 and 56. The biasing network includes the resistors 59 and 60 connected between the supply point 49 and ground. The junction of the resistors 59 and 60 is connected to the emitter electrode of the transistor 58. The biasing network also includes a resistor 63 connected between the supply point 49 and the base electrode of the transistor 58, and series resistors 61 and 62 connected between the supply point 49 and ground, the junction of which is connected to the diodes 55 and 56. The collector electrode of the transistor 58 is connected to the base electrode of a transistor 64 and to ground through a resistor 65.

The transistor 64 is connected in a common emitter configuration with its collector electrode connected to the supply point 49 through a resistor 66 and its emitter electrode connected to ground through a resistor 67. The positive signal pulses developed across the resistor 67 are passed by a diode 68 and filtered by a capacitor 69. A portion of the D-C output signal developed across the filter capacitor 69 is applied through the potentiometer 70 and the isolation resistor 54 to the gate electrode of the insulated-gate field-effect transistor 40. A diode 68 prevents excessive reverse biasing of the transistor 64. A diode 71 is connected between the gate electrode and the source electrode of the insulated-gate field-effect transistor 40 to prevent excessive gate electrode voltage from damaging the transistor. The isolation resistor 54 insures the effective operation of the diode 71.

In operation, the output of the control circuit 55 is essentially zero volts until a threshold voltage is exceeded. The threshold voltage is exceeded whenever the voltage applied through one of the diodes 55 and 56 is sufficient to drive the transistor 58 into conduction. For example if a positive pulse is applied to the capacitor 57, the diode 56 cuts off and diode 55 conducts to produce a positive peak on the emitter of the transistor 58 to drive it into conduction and to produce positive peak at the base of the transistor 64. On the other hand if a negative pulse is applied through the capacitor 57, the diode 56 conducts and the diode 55 cuts off, producing a negative peak on the base of the transistor 58 to drive it into conduction to also produce a positive peak at the base electrode of transistor 64. The transistor 64 conducts to produce corresponding positive peaks across the resistor 67, which are passed by the diode 68 and filtered by the capacitor 69 to produce a direct current voltage to control the drain-to-source resistance of the insulated-gate field-effect transistor 40.

The control circuit 55 produces sufficient D-C output voltage to bias the gate electrode over the required range of several volts. As noted in FIGURES 1 and 2 an increasing positive voltage on the gate electrode of the insulated-gate field-effect transistor 40 produces a decreasing source-to-gate bias thereby decreasing the drain-to-source resistance, producing a greater voltage drop across the series dropping resistor 44 and developing a smaller voltage across the load resistor 47. The pulses applied to the transistor 64 from the transistor 58 readily saturate the transistor 64 and the capacitor 69 changes rapidly providing a fast attack time for rapid changes in input signal level applied to the input terminal.

If a linearizing signal was applied to the gate, an audio bypass capacitor would be necessary between the junction of resistor 54 and the variable arm of the potentiometer 70 and ground to prevent the setting of potentiometer 70 from influencing the amount of linearizing signal appearing at the gate electrode. Such a capacitor would degrade the attack time of the system. In addition any network applying a signal to the gate would undesirably load the control circuit.

The control circuit 55 can be modified to change the circuit of FIGURE 6 from operating as a peak limiter to a compression and expansion circuit by changing the values of resistors 59–63 to bias the transistors 58 into conduction with zero signal in. In such a case, the control circuit will operate over the entire range of input signal applied to the input terminal 42.

The potentiometer 70 provides an adjustment to control the amount of control voltage being applied to the gate electrode for a given amount of amplifier output. The adjustment is necessary in order to provide accurate matching of gains when two or more systems are controlled simultaneously to compensate for the difference in insulated-gate field-effect transistor transconductance characteristics from unit to unit.

What is claimed is:

1. A variable resistance circuit comprising:

a symmetrical insulated-gate field-effect transistor including source and drain regions formed on a substrate of semiconductor material having electrodes connected to each of said regions and said substrate, the portion of said substrate separating said source and drain regions providing a current path of controllable resistivity, and a gate electrode insulated from said substrate and overlying at least a portion of the substrate to be substantially symmetrically displaced between said source and drain regions, said transistor exhibiting a first predetermined transconductance characteristic for signals applied between said source region and said substrate electrode and a second predetermined transconductance characteristic for signals applied between the source electrode and said substrate and gate electrodes when connected together;

a pair of input terminals for applying signals to be translated by the variable resistance circuit;

a pair of output terminals;

means, including said insulated-gate field-effect transistor, coupling said input terminals and said output terminals to control the efficiency of signal translation between said input and output terminals as a function of the resistance exhibited by said current path;

means coupled to said gate electrode for applying a voltage to said gate electrode for controlling the resistivity of said current path, and means coupled to said pair of output terminals for developing a signal, that is in phase with the signal applied across said input terminals and for applying said developed signal to said substrate electrode to linearize the bidirectional operation of said transistor, the amplitude of said substrate applied signal being a function of the ratio of said first and second transconductance characteristics as given by the expression:

$$E_{s\mu}=gm_2 E_0/2gm_1$$

where $E_{s\mu}$, $E_0$, $gm_1$ and $gm_2$ respectively represent the amplitude of the signal applied to the substrate electrode, the signal developed across said pair of output terminals, and said first and second predetermined transconductance characteristics.

2. In combintaion:

a symmetrical semiconductor device having first and second electrodes formed on a substrate of semiconductor material defining a current path of controllable resistivity, and a control electric substantially symmetrically displaced between said first and second electrodes, said control electrode and said substrate being adapted to control the resistance of said current path, said semiconductor device exhibiting a first transconductance characteristic for signals applied between said substrate and first electrodes and exhibiting a second transconductance characteristic for signals applied between said substrate and said control electrode when connected together and said first electrode;

a pair of input terminals for applying signals to be translated;

a pair of output terminals;

means, including said semiconductor device, coupling said input terminals and said output terminals to control the efficiency of signal translation between said input and output terminals as a function of the resistance exhibited by said current path;

means coupled to said control electrode for applying a signal to said control electrode for controlling the resistivity of said current path; and means coupled to said pair of output terminals for developing a signal that is in phase with the signal applied across said input terminals and for applying said developed signal to said substrate to linearize the bidirectional operation of said device, the amplitude of said substrate applied signal being a function of the ratio of said first and second transconductance characteristics as given by the expression:

$$E_{s\mu}=gm_2 E_0/2gm_1$$

where $E_{s\mu}$, $E_0$, $gm_1$ and $gm_2$ respectively represent the amplitude of the signal applied to the substrate, the signal developed across said pair of output terminals, and said first and second transconductance characteristics.

3. A variable resistance circuit comprising:

a symmetrical insulated-gate field-effect transistor including source and drain regions formed on a substrate of semiconductor material having electrodes connected to each of the regions and said substrate, the portion of said substrate separating said source and drain regions providing a current path of controllable resistivity and a gate electrode insulated from said substrate and overlying at least a portion of the substrate to be substantially symmetrically displaced between said source and drain regions, said transistor exhibiting a first predetermined transconductance characteristic for signals applied between said source region and said substrate electrode and a second predetermined transconductance characteristics for signals applied between the source electrode and said substrate and gate electrodes when connected together;

a pair of input terminals for applying signals to be translated by the variable resistance circuit, one of said pair of terminals being connected to a point of reference potential;

an amplifier circuit including an input terminal, and an output terminal;

circuit means for connecting a resistor between the other of said input terminals and the amplifier input terminal;

circuit means coupling said drain electrode to said amplifier input terminal;

impedance means exhibiting a low impedance to signal frequencies coupling said source electrode to said point of reference potential;

biasing means connected between said drain and source electrodes and said point of reference potential for biasing said drain and source electrodes with respect to said gate electrode;

means for applying a control voltage between said gate electrode and said point of reference potential for controlling the resistivity of said control path as a function of the voltage applied to said gate electrode; and circuit means connecting the output terminal of said amplifier to said substrate electrode for developing signal voltages that are in phase with the signals applied to said other one of said pair of input terminals and for aplying said developed signal voltages to said substrate electrode to linearize the bidirectional operation of said transistor, the amplitude of said substrate applied signal being a function of the ratio of said first and second transconductance characteristics as given by the expression:

$$E_{s\mu}=gm_2E_0/2gm_1$$

where $E_{s\mu}$, $E_0$, $gm_1$ and $gm_2$ respectively represent the amplitude of the signal voltage applied to the substrate electrode, the signal voltage developed across said pair of output terminals, and said first and second predetermined transconductance characteristics.

4. A variable resistance circuit comprising:

a symmetrical insulated-gate field-effect transistor including source and drain regions formed on a substrate of semiconductor material having electrodes connected to each of said regions and said substrate, the portion of said substrate separating said source and drain regions providing a current path of controllable resistivity and a gate of electrode insulated from said substrate and overlying at least a portion of the substrate to be substantially symmetrically displaced between said source and drain regions, said transistor exhibiting a first predetermined transconductance characteristic for signals applied between said source region and said substrate electrode and a second predetermined transconductance characteristic for signals applied between the source electrode and said substrate and gate electrodes when connected together;

a pair of input terminals for applying signals to be translated by the variable resistance circuit, one of said pair of terminals being connected to a point of reference potential;

an amplifier circuit including an input terminal and an output terminal and a resistor connected between the input terminal and said point of reference potential;

circuit means for connecting a resistor between the other one of said pair of input terminals and the amplifier input terminal;

circuit means coupling said drain electrode to said amplifier input terminal;

impedance means exhibiting a low impedance to signal frequencies coupling said source electrode to said point of reference potential;

biasing means connected between said drain and source electrodes and said point of reference potential for biasing said drain and source electrodes with respect to said gate electrode;

means for applying a control voltage between said gate electrode and said point of reference potential for controlling the resistivity of said control path as a function of the voltage applied to said gate electrode;

a voltage divider connected between said amplifier output terminal and said point of reference potential; and circuit means for coupling said voltage divider to said substrate electrode for developing signal voltages that are in phase with the signals applied to said other one of said pair of input terminals and for applying said developed signal voltages to said substrate to linearize the bidirectional operation of said transistor, the amplitude of said substrate applied signal being a function of the ratio of said first and second transconductance characteristics as given by the expression:

$$E_{s\mu}=gm_2E_0/2gm_1$$

where $E_{s\mu}$, $E_0$, $gm_1$ and $gm_2$ respectively represent the amplitude of the signal voltage applied to the substrate electrode, the signal voltage developed across said pair of output terminals, and said first and second predetermined transconductance characteristics.

References Cited

UNITED STATES PATENTS

| | | | |
|---|---|---|---|
| 2,870,271 | 1/1959 | Cronburg et al. | 333—14 |
| 3,131,312 | 4/1964 | Putzrath | 307—88.5 |
| 3,213,299 | 10/1965 | Rogers | 307—88.5 |
| 3,246,177 | 4/1966 | Schroeder | 307—88.5 |
| 3,260,948 | 7/1966 | Theriault | 330—38 |
| 3,268,658 | 8/1966 | Schroeder | 307—88.5 |
| 3,311,756 | 3/1967 | Nagata et al. | 330—38 |
| 3,330,973 | 7/1967 | Clapper | 307—88.5 |
| 3,334,308 | 8/1967 | Epstein | 330—38 |

ARTHUR GAUSS, *Primary Examiner.*

H. A. DIXON, *Assistant Examiner.*

U.S. Cl. X.R.

307—304